US008410792B2

(12) United States Patent
Klein et al.

(10) Patent No.: US 8,410,792 B2
(45) Date of Patent: Apr. 2, 2013

(54) RESONATOR ARRANGEMENT AND METHOD FOR ANALYZING A SAMPLE USING THE RESONATOR ARRANGEMENT

(75) Inventors: Norbert Klein, Staines (GB); Svetlana Vitusevich, Dueren (DE); Serhiy Danylyuk, Juelich (DE)

(73) Assignee: Forschungszentrum Juelich GmbH, Juelich (DE)

( * ) Notice: Subject to any disclaimer, the term of this patent is extended or adjusted under 35 U.S.C. 154(b) by 342 days.

(21) Appl. No.: 12/660,554

(22) Filed: Mar. 1, 2010

(65) Prior Publication Data

US 2010/0327996 A1 Dec. 30, 2010

Related U.S. Application Data

(60) Provisional application No. 61/208,937, filed on Mar. 2, 2009.

(51) Int. Cl.
*G01R 27/04* (2006.01)
*H03B 5/08* (2006.01)
*H01P 7/10* (2006.01)
*H01P 7/06* (2006.01)

(52) U.S. Cl. ..... 324/636; 324/633; 324/652; 331/117 R; 331/167; 333/219.1; 333/227

(58) Field of Classification Search .......... 324/633–636, 324/652, 653; 331/107, 117, 167, 117 R; 333/197, 219–235
See application file for complete search history.

(56) References Cited

U.S. PATENT DOCUMENTS 4,087,738 A * 5/1978 Van Degrift et al. .......... 324/636
4,103,224 A 7/1978 Taro et al.
4,728,913 A * 3/1988 Ishikawa et al. .......... 333/219.1
4,868,488 A * 9/1989 Schmall .................... 333/219.1
5,105,158 A * 4/1992 Fiedziuszko et al. ...... 333/219.1
5,177,445 A * 1/1993 Cross ........................... 324/637
6,472,955 B2 * 10/2002 Saito et al. ................ 333/219.1
6,549,104 B1 * 4/2003 Ghosh et al. ............... 333/219.1
6,903,627 B2 * 6/2005 Wakamatsu et al. ....... 333/219.1
7,005,951 B2 * 2/2006 Motooka et al. .............. 333/235
RE40,488 E * 9/2008 Nagata et al. ................. 324/633
2009/0275814 A1 * 11/2009 Watanabe et al. ............. 600/316

FOREIGN PATENT DOCUMENTS

DE 893 521 7/1949
DE 23 28 590 1/1975
DE 195 00 559 7/1996
DE 10 2006 046 657 4/2008
DE 10 2007 014 492 9/2008
EP 1 091 441 4/2001

(Continued)

OTHER PUBLICATIONS

Ebbe Nyfors and Pertti Vainikainen: "Industrial Microwave Sensors", Industrial Microwave Sensors, Jan. 1, 1989, XP002334964, figures 3.2, 3.13, 3.14, p. 130, paragraph 2, p. 153-p. 154.

(Continued)

*Primary Examiner* — Amy He
(74) *Attorney, Agent, or Firm* — Jordan and Hamburg LLP

(57) ABSTRACT

A resonator arrangement has a conductive, semi-open outer housing, at an interior of which a conductive bar is provided disposed coaxially to the housing. At one end of the bar in a direction of a housing bottom, the bar has a die and, together with a dielectric and the housing bottom, forms a capacitor. The bar is short-circuited to the housing at another end, so that the bar and housing together form an LC oscillator circuit. Also disclosed is a method for analyzing a sample using a resonator arrangement.

8 Claims, 3 Drawing Sheets

FOREIGN PATENT DOCUMENTS

| | | |
|---|---|---|
| EP | 1 371 978 | 12/2003 |
| JP | 54-010796 | 1/1979 |
| JP | 55-069043 | 5/1980 |
| JP | 2-272349 | 11/1990 |
| WO | WO-2008/040305 | 4/2008 |

OTHER PUBLICATIONS

R.J. King: "Chapter 5 On-line Industrial Applications of Microwave Moisture Sensors" In: H. Baltes, W. Goepel, J. Hesse (Editors), K. Kupfer, A. Kraszewski, R. Knoechel (Guest Editors): "Sensors Update, Special Topic: RF & Microwave Sensing of Moist Materials", 2000, Wiley-VCH, Weinheim, XP002601635, ISBN: 3-527-29821-5, vol. 7, pp. 109-170, p. 145-p. 147; figures 5.16, 5.18.

Krause H-J et al: "Dielectric microwave resonator for non-destructive evaluation of moisture and salinity", 9th European Conference on NDT; ECNDT Berlin 2006; Sep. 25-29, 2006, European Federation for Non-destructive Testing, Berlin, Sep. 29, 2006, pp. 1-12, XP008104806, ISBN: 978-3-931381-86-8, figure 1.

Krzysztof A. Michalski: "Chapter 5 "Rigorous Analysis Methods"", Darko Kajfez and Pierre Guillon (Editors): "Dielectric Resonators", Noble Publishing Corporation, [online] 1998, pp. 185-257, XP00263080, Atlanta, ISBN: 1-884932-05-3, Retrieved from the Internet: URL:http://proxy.bookfi.org/genesis1/165000/1a2cea8c18fez%20and%20Pierre%20Guillon%5D_%EP%BB%BFDielectric%20Resonators(BookFi.org).pdf >, [retrieved on Mar. 28, 2011], p. 191, paragrpah 1, p. 230, last paragraph-p. 240.

Matjaz Valanta, Danilo Suvorov, Sreco Maceka: "Measurement error analysis in the determination of microwave dielectric properties using cavity reflection method", Ferroelectrics, vol. 176, 1996, pp. 167-177, XP9146429, Switzerland, ISSN: 0015-0193, p. 168, paragraph 3-paragraph 5; figure 2.

Svetlana A Vitusevich et al: "Design and Characterization of an All-Cryogenic Low Phase-Noise Sapphire <math><tex>$K$</tex></maths>-Band Oscillator for Satellite Communication", IEEE Transactions on Microwave Theory and Techniques, IEEE Service Center, Piscataway, NJ, US, vol. 51, No. 1, Jan. 1, 2003, XP011076848, ISSN: 0018-940, p. 164, right-hand col., p. 165, right-hand col., figures 3, 4: table 1.

Zhihong Ma, Seichi Okamura and Tomoyasu Kawasaki: "A Fundamental Study on Microstrip Sensor for Measuring Water Content and Ion Conductivity", Fourth International Conference on Electromagnetic Wave Interaction with Water and Moist Substances, [online] May 13, 2001-May 16, 2001, pp. 462-467, XP002630492, Weimar/Germany, Retrieved from the Internet: URL:http://www.isema-online.com/uploads/2001_Proceedings.pdf>, [retrieved on Mar. 29, 2011] the whole document.

* cited by examiner

RESONATOR ARRANGEMENT AND METHOD FOR ANALYZING A SAMPLE USING THE RESONATOR ARRANGEMENT

BACKGROUND OF THE INVENTION

The invention relates to a resonator arrangement and to a method for analyzing a sample using the resonator arrangement.

From DE 102004046657 A1, a method and a device for analyzing a sample in a closed container are known. The sample is analyzed using a semi-open dielectric resonator.

The disadvantage of this device and the method disclosed therein is that a qualitative differentiation of different, but chemically similar, fluids is not always possible.

SUMMARY OF THE INVENTION

It is the object of the invention to provide an improved device and a corresponding method for identifying a sample.

The object is achieved by a device and by a method. Advantageous embodiments will be apparent from the further disclosure.

The resonator arrangement comprises a conductive, preferably metallic, semi-open housing. The housing preferably has a circular cylindrical shape. Input antennas for a coaxial resonator are disposed in the housing. The coaxial resonator comprises a conductive bar, which is coaxially enclosed by the metallic housing. The bar is preferably disposed centrally in the housing. The bar expands toward the housing bottom in a die- or plate-shaped manner. At this end of the bar, the plate shape forms a capacitive load of the coaxial resonator, together with the dielectric and the housing bottom, which serves as the second plate of the capacitor. At the opposite part of the coaxial part of the bar, the bar is short-circuited to the housing. The bar and the housing together form an LC oscillator circuit.

The short circuit to the housing is preferably achieved by a shorting bar, such as a cross bracket, which radially connects the upper bar end to the housing. This arrangement of a coaxial resonator is advantageously very compact. The semi-open design of the arrangement ensures that the magnetic field of the shorting bar can be used for measuring the conductivity of a sample disposed above.

The high quality factors that are achievable with this arrangement, such as 700 for a resonant frequency of 100 MHz, are advantageously used for analyzing a sample.

In an advantageous embodiment of the invention, the coaxial bar is guided through a preferably circular cylindrical dielectric resonator in the interior of the housing. The bar and the dielectric resonator surrounding the same are preferably disposed centrally in the housing and are in turn enclosed coaxially by the same. This has the particularly advantageous effect that both the magnetic field of the cross bracket and the electric field of the dielectric resonator can be used at the same time for the analysis of a sample disposed above the semi-open housing. For this purpose, coupling loops are present, for example, in the cylinder wall of the housing for exciting the mode of the dielectric resonator. In this way, the resonator arrangement constitutes a dual-mode resonator. A particularly advantageous effect is that the electric field of the dielectric resonator and the magnetic field of the cross bracket do not negatively influence each other in the process. As a result, an extremely compact resonator arrangement is provided, which ensures a high-quality differentiation of samples. Advantageously, high quality factors can be achieved in both modes of the resonator arrangement. It is furthermore advantageous that both modes can exhibit very different resonant frequencies, such as 100 MHz and 2 GHz.

The resonator arrangement is disposed such that the dielectric resonator is disposed centrally in the metallic housing and together with the housing coaxially encloses the bar.

The resonator arrangement comprises means for exciting the mode of the coaxial LC oscillator circuit and means for exciting modes of the dielectric resonator.

In the resonator arrangement, the dielectric resonator for determining the dielectric relaxation is used at frequencies above 1 GHz, and the capacitively loaded coaxial resonator for determining the electric conductivity is used at frequencies between approximately 1 and 500 MHz, and preferably 10 and 500 MHz.

The modes of the dielectric resonator and the LC oscillator circuit are excited simultaneously, and a spatially overlapping evanescent field is generated outside of the resonator arrangement for both modes. Thereafter, the dielectric relaxation and electric conductivity can be determined at the same time using the resonator arrangement in order to analyze the sample. Advantageously, it is thus no longer necessary to change the position of the sample with respect to the resonator arrangement, during the measurements of the two resonant frequencies.

A high-frequency signal is coupled into the resonator arrangement for exciting the resonant mode of the dielectric resonator, the resonance curve of at least one resonant mode is measured, and the sample is identified from the change of the resonant frequency that is determined compared to a measurement without a sample container. The corresponding measurement of the resonance curve of the LC oscillator circuit should be carried out with a frequency difference of approximately at least half a decade.

The excitation is preferably carried out using microwave radiation greater than 1 GHz for the dielectric resonator and using microwave radiation in the range of approximately 1 to 500 MHz for the LC oscillator circuit. The quality of the LC oscillator circuit depends on the frequency and can be 700 for 100 MHz, for example.

The two modes have spatially overlapping evanescent fields outside of the resonator arrangement, which are particularly preferably in the same location, based on which, the sample is analyzed. In this way, it is ensured that fluids can be analyzed at a single measuring site largely independently of shape and size thereof, even in closed containers. Due to the high quality factors and low resonant frequencies of the coaxial mode, the electric conductivity can be determined with high precision by way of the change of the quality factor.

When combining these measurements with the measured changes in quality and resonant frequency, it is possible to very precisely and quickly analyze any samples, which is to say liquid and solid samples, and though the invention is not limited thereto, notably also liquid samples in closed containers, based on the dielectric properties and conductivity.

The device according to the invention allows, for example, a simultaneous excitation of a $TE_{0m.n+\delta}$ mode of a circular cylindrical dielectric resonator and of a capacitively loaded coaxial mode having a considerably lower resonant frequency.

It was found that the field distribution and the quality factor of the mode of the dielectric resonator are only slightly influenced by the die of the bar, the dielectric, and the coupling antennas for the coaxial mode in this resonator arrangement. For this reason, the mode can be used for identifying fluids. In this way, after measurement against air, the characteristic change of the ratio the resonant frequency to quality, and preferably the ratio of the resonant frequency to reciprocal quality, produced by the sample can be determined.

In addition, it was also found that the electric field of the coaxial mode is concentrated almost completely in the gap between the die and the housing bottom, so that the dielectric resonator has only a marginal frequency-lowering effect. The magnetic field of the shorting bar extends into the outer region and can be used for the conductivity measurements.

The spatially overlapping evanescent electric fields of the mode of the dielectric resonator and of the magnetic field of the coaxial mode in the outer region allow the properties of the samples to be measured for both resonant frequencies in a single position, without having to change the position of the sample, or of a sample container, with respect to the resonator arrangement.

It was further found, within the scope of the invention, that the complex dielectric function $\epsilon(\omega)=\epsilon_1(\omega)+i\epsilon_2(\omega)$ as a characteristic of fluids, allows a differentiation on the basis of different physical mechanisms. In the process, the real part $\epsilon_1(\omega)$ substantially enables a differentiation of fluids based on the electric polarizability and dielectric relaxation of the molecules. This advantageously results in very easy differentiation of aqueous fluids from organic fluids, for example.

Particularly in the case of aqueous fluids, a precise differentiation by way of the electric conductivity is possible, the conductivity resulting from the ions present in the fluid and producing a contribution of $1/\omega$ to the imaginary part $\epsilon_2(\omega)$ of the complex dielectric function:

$$\varepsilon(\omega) = \frac{\varepsilon_S(T) - \varepsilon_\omega(T)}{1 + i\omega\tau(T)} + \frac{\sigma}{i\omega\varepsilon_0} \qquad \text{Equation 1}$$

The statistical dielectric constant is denoted with $\epsilon_S(T)$ which, with values of around 80 in water, for example, is considerably above the values of all known organic fluids. $\epsilon_\omega(T)$ is the optical dielectric constant, and $\tau(T)$ is the highly temperature-dependent relaxation time which, for water at room temperature, is approximately 6 ps, and therefore results in strong frequency dependency for $\epsilon_1(\omega)$ and $\epsilon_2(\omega)$.

In particular, the high value of $\epsilon_2(\omega)$ in the microwave range with a maximum at approximately 20 GHz causes water to absorb microwaves very strongly. In contrast, over the range of $\epsilon_2(\omega)$, at frequencies below approximately 500 MHz, the contribution of ion conductivity ( $\sigma$ in equation 1), which increases as the frequency decreases, in aqueous drinkable or cosmetic fluids, dominates over the losses which increase as the frequency increases due to the molecular relaxation of the water molecules. This dominance can be preserved even at higher frequencies for fluids with high salt contents or strong acids and bases.

The arrangement according to the invention allows, for example, for the simultaneous excitation of a $TE_{0m,n+\delta}$ mode of a circular cylindrical resonator in the microwave range (in the exemplary embodiment $TE_{01\delta}$ mode at 2.2 GHz) using a mode of a capacitively loaded coaxial resonator at considerably lower frequencies (in the exemplary embodiment approximately 100 MHz).

The invention will be explained in more detail hereinafter with reference to one embodiment and the attached drawings.)

DESCRIPTION OF THE PREFERRED EMBODIMENTS

Figure 1:
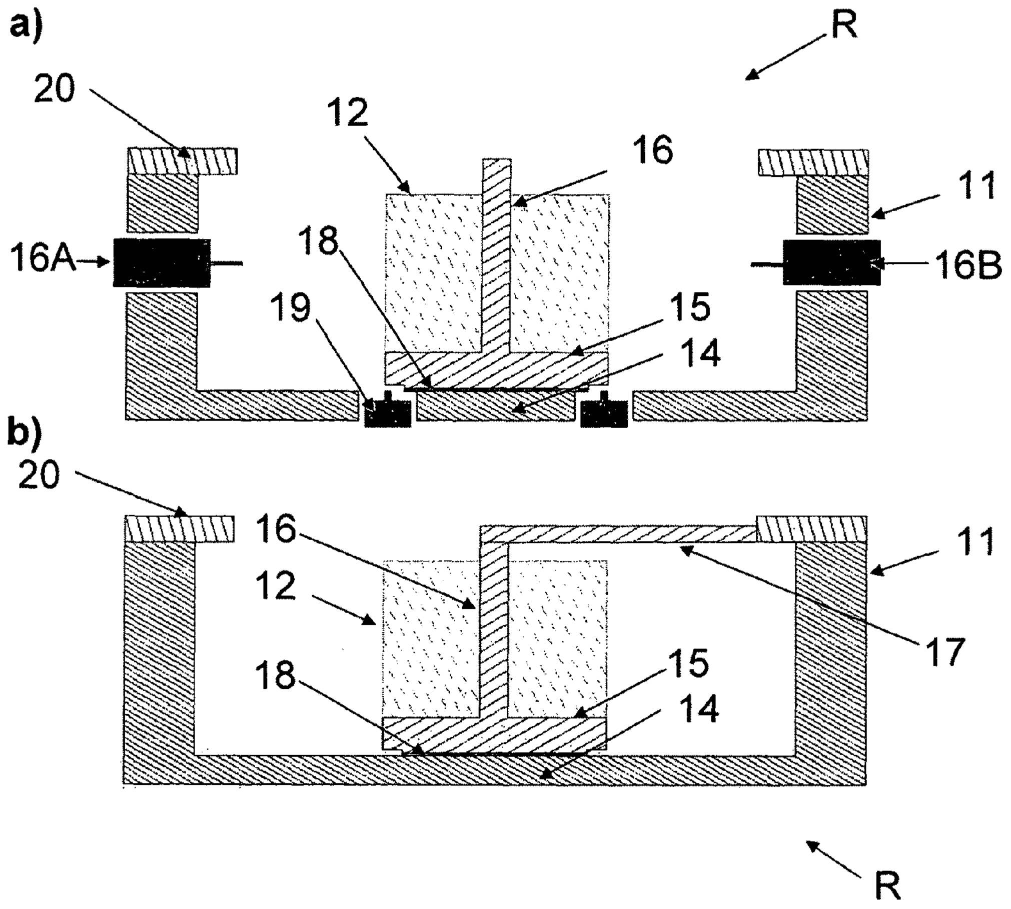
FIG. 1 resonator arrangement according to the invention

FIG. 1*a* and FIG. 1*b* show two cross-sections of a resonator arrangement R according to the invention, disposed 90° relative to each other, comprising an LC oscillator circuit and optionally a dielectric resonator 12. The parts of the figures are represented to scale.

The circular cylindrical metal housing 11 has a diameter of approximately 60 millimeters at 2 GHz and 100 MHz. It is made of silver-plated aluminum, or of copper. At the center of the housing, an optional dielectric resonator 12 is shown. This resonator, as well as the housing 11, coaxially encloses a conductive bar 16 of the LC oscillator circuit disposed therein. A cross bracket 17 (FIG. 1*b*), in the form of a shorting bar, connects the upper end of the conductive bar 16 radially to the outer housing 11.

In addition, coupling loops 16A and 16B for excitation of the dielectric resonator mode are shown.

Inside the cylindrical metal housing 11 having high conductivity, a metal die 15, which is conductively connected to the preferably cylindrical bar 16 and is preferably produced in one piece, is disposed on a planar bottom plate 14 as centrally as is possible.

The metal disk 15, which is made of highly conductive material, such as copper, is separated from the housing bottom 14 by way of the dielectric 18 comprising material having a high dielectric constant and low loss; together with the bottom and the dielectric, it forms a plate capacitor. The dielectric is made, for example, of sapphire, microwave ceramic or plastic film, or is simply formed by an air gap, and is electrically isolated from the housing 14. The cylindrical metal bar 16 forms the inner conductor of a short coaxial line and also the centering element and mount for the circular cylindrical dielectric resonator 12, which is provided with a central bore matching the cylindrical bar 16. In the arrangement according to the invention, at the upper end of the coaxial line, the inner conductor 16 (FIG. 1*b*) is connected to the housing 11 in an electrically conductive manner, by a radially outwardly extending metal bar in the form of the cross bracket 17 having high conductivity, which is made of copper or the like. The entire arrangement comprising the housing, bottom plate, dielectric, bar, and cross bracket constitutes a coaxial resonator, which at the electrically open end is terminated at the bottom by high capacitance and at the electrically closed end is terminated at the top by low inductance. The combination of high capacitance and low inductance is the key for the high quality levels at low frequencies—contrary to resonant coils—typically used in the MHz range.

The resonant frequency of the coaxial mode depends on the thickness of the dielectric 18. If the embodiment comprises an air gap, the height of which can be adjusted from the outside, for example, by piezo actuators (not shown), the resonant frequency can be varied by an externally applied voltage. In this way, the selectivity for the identification of a sample can be further increased.

The excitation of a $TE_{0m,n+\delta}$ mode takes place by way of coaxial loops 16A and 16B in the cylindrical side wall of the housing 11, and the excitation of the coaxial mode takes place by way of coaxial antennas 19, which are introduced into the high electric field of the capacitor. In FIG. 1, because of the coupling, the diameter of the insulating disk 18 is selected slightly smaller compared to that of the die 15, so as to allow the coaxial antennas 19 to be lowered into the air gap. In the exemplary embodiment, the die 15, the bar 16, and the plate 18 are fixed by a metal panel 20, or by screw fittings, to the housing bottom 14.

For each of the two modes, two connections are provided such that the resonance curves can be measured, preferably in transmission mode, by a network analyzer or by a network analyzer with integrated changeover switches. Measurements in reflection mode at one of the connections are likewise possible.

Figure 2:
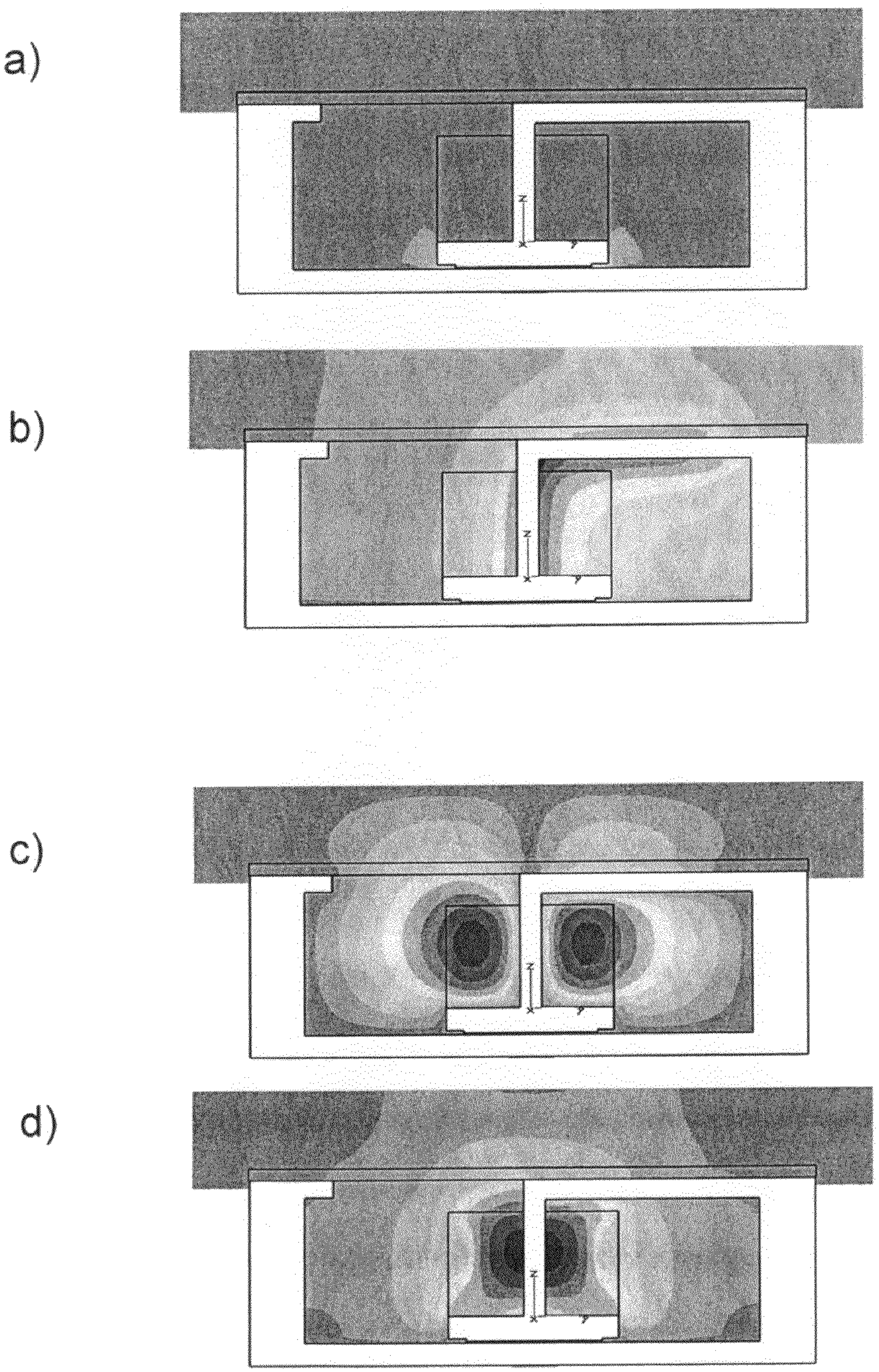
FIG. 2 numerically calculated spatial distribution of the resonant field strengths: coaxial, electric (a), coaxial magnetic (b), $TE_{01\delta}$ electric (c), $TE_{01\delta}$ magnetic.

FIGS. 2*a*) to 2*d*) show the numerically calculated spatial distributions of the electric and magnetic fields for the coaxial mode and the $TE_{01\delta}$ mode (coaxial, electric (FIG. 2*a*), coaxial magnetic (FIG. 2*b*), $TE_{01\delta}$ electric (FIG. 2*c*), and $TE_{01\delta}$ magnetic (FIG. 2*d*)).

Based on these calculations, the following conclusions can be drawn for the function of the resonator as a dual-mode sensor for fluids in closed containers:

1) For the coaxial mode, the field distribution and quality factor of the $TE_{01\delta}$ mode is influenced very little by the metal die 15, the insulating plate 18, and the coupling antennas 19. Only the shorting bar 17 causes a slight local deformation of the fields, which is not visible in FIG. 2*c* and FIG. 2*d*. This is due to the fact that the electric fields of the $TE_{01\delta}$ mode have a circular path (FIG. 2*b*), which is to say perpendicular to the orientation of the shorting bar. For this reason, the $TE_{01\delta}$ mode can be used to identify fluids.

2) The electric field of the coaxial mode (FIG. 2*a*) is concentrated almost completely (light area) in the gap between the die 15 and housing bottom 14, such that the dielectric resonator 12 has only a marginal frequency-lowering effect. The magnetic field of the shorting bar (FIG. 2*b*) extends into the outer region (light area) and can be used for the conductivity measurements.

3) The electric field of the $TE_{01\delta}$ mode in the outer region (FIG. 2*c*—light area) and the magnetic field of the coaxial mode (FIG. 2*b*—light area) overlap evanescently in the outer region at a location at which the sample is disposed. This allows the properties of the sample to be measured for both resonant frequencies, even in closed containers, in a single position, without having to change this position of the container with respect to the resonator arrangement.

Figure 3:
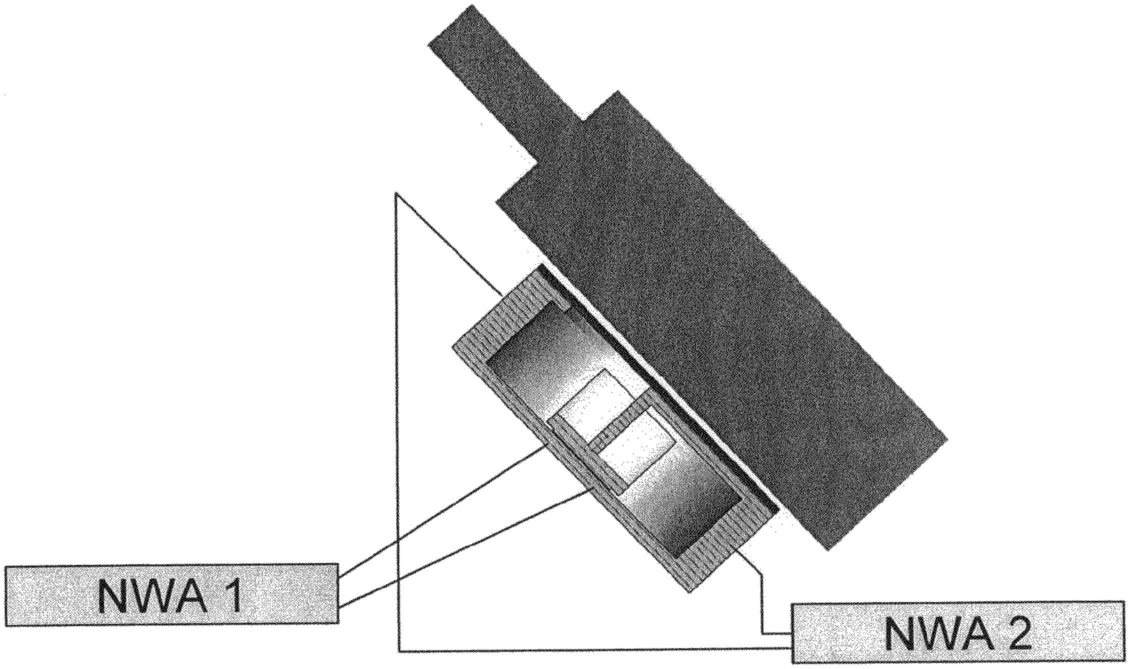
FIG. 3 device for identifying fluids in bottles using a resonator according to FIG. 1 and measurement by way of two network analyzers.

FIG. 3 shows an arrangement according to the invention for use of the resonator arrangement with a dual-mode resonator for identifying a fluid in a closed container. The bottle is placed laterally and as centrally as is possible onto a retaining plate of the resonator. The best coaxial mode coupling to the fluid is achieved if the axis of the bottle is disposed parallel to the shorting bar 17 in FIG. 1. Using the two network analyzers NWA 1 and NWA 2, the changes in quality and resonant frequency caused by the particular bottle in the two modes are measured. In order to analyze the dielectric constant by way of the dielectric resonator, the ratio of the change in the resonant frequency to the change in the reciprocal quality is preferably used. For the conductivity measurements, the change in the reciprocal quality of the coaxial mode caused by the bottle can be used.

Using the arrangement from the example, regular tap water can be clearly differentiated from distilled water.

Applications of the device according to the invention relate to use for the detection of samples in closed containers and for the detection of water, fat and salt content, or acid content in tissues and other samples, such as medical samples (tissue and the like).

It is expressly noted that the arrangement R shown in FIG. 1 is already fully functional without the dielectric resonator.

It is further pointed out that any resonator arrangement can solve the problem of the invention, which comprises an LC oscillator circuit and a dielectric resonator, wherein the mode of the LC oscillator circuit and that of the dielectric resonator are excited simultaneously, and wherein a spatially overlapping evanescent field can be produced outside of the resonator arrangement for both modes at the site of the sample, so that dielectric relaxation and electric conductivity can be determined at the same time for analysis of the sample.

The invention claimed is:

1. A resonator arrangement, comprising:
- a conductive, semi-open outer housing defining an interior cavity, and having a housing bottom forming a cavity bottom surface of the interior cavity, and the housing defining a cavity top opening communicating the interior cavity to an exterior surrounding;
- a conductive bar disposed coaxially with respect to the housing and in the interior cavity, the bar having a first end directed toward the cavity bottom surface and a second end directed toward the cavity top opening, and the bar having a disc at the first end which extends radially outward of the bar, the bar being short-circuited to the housing at the second end, so that the bar and housing together form an LC resonator circuit;
- a dielectric disposed between the cavity bottom surface and the disc so as to form a capacitor;
- a dielectric resonator disposed in the interior cavity and the conductive bar being led through the dielectric resonator;
- means for exciting a coaxial mode of the LC resonator circuit; and
- means for exciting a mode of the dielectric resonator.

2. A resonator arrangement according to claim 1, wherein the bar is short-circuited by a cross bracket, which radially short-circuits the bar to the housing.

3. A resonator arrangement according to claim 1, wherein the dielectric resonator determines dielectric relaxation at frequencies above 1 GHz and the LC resonator circuit determines conductivity at frequencies between 1 and 500 MHz.

4. A resonator arrangement according claim 1, wherein the dielectric resonator is disposed centrally in the housing and coaxially encloses the bar.

5. A resonator arrangement according claim 4, wherein the dielectric resonator is a circular cylindrical dielectric resonator.

6. A method for analyzing a sample using a resonator arrangement according to claim 1, comprising:
- disposing the sample adjacent said cavity top opening;
- exciting the mode of the LC resonator circuit and the mode of the dielectric resonator simultaneously to produce a spatially overlapping evanescent field outside of the resonator arrangement for both modes, at a site of the sample; and
- determining dielectric relaxation and electric conductivity at the same time for analysis of the sample.

7. The method according to claim 6, wherein an excitation frequency greater than 1 GHz for the dielectric resonator and an excitation frequency in the range of 1 to 500 MHz for the LC oscillator resonator circuit are used.

8. A resonator arrangement, comprising:
- an LC resonator circuit;
- a dielectric resonator;
- means for exciting simultaneously a mode of the LC resonator circuit and a mode of the dielectric resonator;
- means for producing a spatially overlapping evanescent field outside of the resonator arrangement for both said simultaneously excited modes at a site of a sample; and
- means for determining dielectric relaxation and electric conductivity at the same time for analysis of the sample.

* * * * *